(12) United States Patent
Nukeaw et al.

(10) Patent No.: US 8,372,250 B2
(45) Date of Patent: Feb. 12, 2013

(54) GAS-TIMING METHOD FOR DEPOSITING OXYNITRIDE FILMS BY REACTIVE R.F. MAGNETRON SPUTTERING

(75) Inventors: Jiti Nukeaw, Bangkok (TH); Supanit Porntheeraphat, Pathumthani (TH); Apichart Sungthong, Bangkok (TH)

(73) Assignees: National Science and Technology Development Agency, Bangkok (TH); King Mongkut's Institute of Technology Ladkrabang, Bangkok (TH)

( * ) Notice: Subject to any disclaimer, the term of this patent is extended or adjusted under 35 U.S.C. 154(b) by 1295 days.

(21) Appl. No.: 11/878,270

(22) Filed: Jul. 23, 2007

(65) Prior Publication Data

US 2009/0026065 A1    Jan. 29, 2009

(51) Int. Cl.
*C23C 14/54* (2006.01)
(52) U.S. Cl. .............................. 204/192.12; 204/298.07
(58) Field of Classification Search ............. 204/192.12, 204/298.07
See application file for complete search history.

(56) References Cited

U.S. PATENT DOCUMENTS

| | | | | |
|---|---|---|---|---|
| 4,289,797 A | * | 9/1981 | Akselrad | 427/539 |
| 4,436,770 A | * | 3/1984 | Nishizawa et al. | 427/570 |
| 6,217,719 B1 | * | 4/2001 | Kanazawa et al. | 204/192.12 |

* cited by examiner

*Primary Examiner* — Keith Hendricks
*Assistant Examiner* — Jason M Berman
(74) *Attorney, Agent, or Firm* — Stites & Harbison, PLLC; Juan Carlos A. Marquez, Esq.; Stephen J. Wever, Esq.

(57) ABSTRACT

A gas-timing control method for depositing metal oxynitride and transition metal oxynitride ($M_x(ON)_y$) films on glass and flexible substrates using reactive radio frequency magnetron sputtering, without substrate heating. A system includes a sputtering chamber, substrates, targets, three mass flow controllers controlled respective flow rates of argon, nitrogen and oxygen gases alternately and intermittently into the sputtering chamber, and a radio frequency generator with 13.56 MHz which irradiated in the sputtering chamber to decompose sputtering gases. The flow rate ratio of oxygen+nitrogen/argon is at least 0.02, the flow rate ratio of oxygen/nitrogen is at least 0.01, and the sequence timing of argon, nitrogen and oxygen gases alternately or mixed into the sputtering chamber at least 1 sec.

15 Claims, 4 Drawing Sheets

(a)

(b)

(c)

(a)

(b)

(c)

GAS-TIMING METHOD FOR DEPOSITING OXYNITRIDE FILMS BY REACTIVE R.F. MAGNETRON SPUTTERING

BACKGROUND OF THE INVENTION

1. Field of the Invention

The present invention concerns a method to deposit oxynitride films ($M_x(ON)_y$) containing at least one of metal, transition metal and transition metal alloy by reactive RF magnetron sputtering.

2. Description of the Related Art

Oxynitride films ($M_x(ON)_y$) films are becoming increasing popular for their electrical, optical, wear resistant, and other functional properties. $M_x(ON)_y$ films are a relatively new class of materials with yet unexplored physical and chemical properties and a great potential for industrial applications. It is possible to continuously vary the values of, for example, refractive indexes, dielectric constants and transmittance of these films by varying the proportions between oxygen and nitrogen which are contained in the films.

For example, by depositing such an oxynitride film on a semiconductor surface, it is possible to use it as a surface passivation film, a surface-protection film, a gate-insulating film of field effect transistors, insulated-gate type static induction transistors, and an insulated-gate type semiconductor integrated circuit with these transistors. In addition, the film may serve as: a selective diffusion film employed in the planar semiconductor device manufacturing technique, a thin encapsulating film employed in a post-ion-implantation annealing technique, a masking film employed in a selective growth technique, a thin insulating film incorporated in active portions of an active device, and an insulating film for passive uses other than the use mentioned above. Furthermore, $M_x(ON)_y$ films are also use in thin film batteries as a solid state electrolyte which is disposed between an anode and a cathode. A suitable electrolyte comprises a lithium phosphorous oxynitride material which may be deposited on a substrate by radio frequency sputtering of a lithium phosphate target in a nitrogen gas.

Driven by improvements in deposition techniques, these thin film materials are commonly used in many vacuum coating applications. Reactive sputtering continues to emerge as one of the most economical methods for depositing compound thin films. With properly configured power delivery and process control measurements, high-rate, arc-free deposition of many oxides and nitrides becomes possible. As reactive sputtering methods becomes matured, interest in extending the technique beyond simple binary compounds has been growing. As material complexity increases, however, so do the challenges of process control as the inventors propose in this application.

The control of three sputtering gases in the sputtering process adds significant complexity and presents the issue of competing reactions. Since three sputtering gases can affect the state of the target surface and the plasma conditions.

Although the concept of reactive sputtering is quite simple, to employ it effectively to produce high quality insulating films at maximum rates is still a challenge. The nature of forming insulating layers in a DC sputter deposition is inherently disruptive to the process. In recent years the issue of arcing in reactive sputtering has been effectively managed by using one of several power delivery techniques. The most common power delivery techniques are applying pulsed-DC in a single magnetron system and applying low frequency AC power in a dual magnetron system. In both cases, a voltage reversal at the cathode is used to effectively eliminate charges built up on the target surface so as to avoid a breakdown event. Many modern power supplies also use arc detection and arc handing circuitry designed to quickly extinguish an arc if occurs.

The use of radio frequency (RF) to sputter materials was investigated in the 1960's. Davidse and Maiseel used RF sputtering to produce dielectric films from a dielectric target in 1966. In 1968, Hohenstein co-sputtered glass using RF and metals (Al, Cu, Ni) with DC, to form cermet resistor films. RF sputter deposition is not used extensively for commercial PVD for several reasons. The major reasons are it is not economic to use large RF power supplies due to high cost, introduction of high temperatures into insulating materials, and the high self-bias voltage associated with RF power.

The term "reactive sputtering" was introduced by Veszi in 1953. Reactive sputtering was used to deposit tantalum nitride for thin film resistors. However it wasn't until the mid-1970s that reactively sputter-deposited hard coatings on tools began to be developed, and they became commercially available in the early 1980s.

The sputtering process has almost no restrictions to the target materials, ranging from pure metals (using a DC-power supply) to semiconductors and isolators (using a RF-power supply or pulsed DC). Deposition is carried out in either non-reactive (inert gas only) or reactive (inert & reactive gas) discharges with single or multi-elemental targets. During the sputtering process, a magnetic field is used to trap secondary electrons close to the target. The electrons follow helical paths around the magnetic field lines undergoing more ionizing collisions with neutral gas near the target than would otherwise occur. This enhances the ionisation of the plasma near the target thereby leading to a higher sputtering rate. It also means that the plasma can be sustained at a lower pressure. The sputtered atoms are neutrally charged such that they are unaffected by the magnetic trap.

The method of gas-sequence control is basically used in epitaxy growth systems such as MOCVD and MOVPE for deposition of thin films.

SUMMARY OF THE INVENTION

In this invention, the timing control of sputtering gas flow rate (gas-timing control) was used to control the deposition of $M_x(ON)_y$ and the compound thin films. The gas-timing method is effectively technique for depositing $M_x(ON)_y$ films on various substrates such as glass, plastic or other flexible substrates without substrate heating by using reactive RF magnetron sputtering system with a good deposition rates. It is also desirable to obtain a stable and easy to control plasma during the sputtering process.

The present invention provides a method, called "gas-timing", to deposit oxynitride materials within a reactive RF magnetron sputtering system, without substrate heating during or post deposition. More particularly, this method effectively deposits various oxynitride films on many types of substrates. The method includes: loading a substrate into a vacuum chamber having the target, introducing the process gas controlled with a gas-timing technique which alternately and/or intermittently sends argon, nitrogen and oxygen into the chamber, and forming plasma of the process gas in the chamber to deposit oxynitride film on the substrate. The gas-timing method is desirable to obtain stable, easy-to-control plasma during the sputtering process and at a high deposition rate.

BRIEF DESCRIPTION OF THE DRAWINGS

Various other objects, features, and attendant advantages of the present invention will become more fully appreciated as the same becomes better understood when considered with the accompanying drawings, in which like reference characters designate the same or similar parts throughout the several views, and wherein.

DETAILED DESCRIPTION OF THE INVENTION

This invention grows $M_x(ON)_y$ films on substrates by RF magnetron sputtering without substrate heating and post annealing to avoid damaging or melting a substrate of plastic or the like. At least one of metal, transition metal, metal alloy and transition metal alloy is used as the target. In particular, the invention deposits metal oxynitride and transition metal oxynitride ($M_x(ON)_y$) films including of boron (B), aluminum (Al), gallium (Ga), indium (In), titanium (Ti), silicon (Si), zinc (Zn), tin (Sn), nickel (Ni), iron (Fe), lithium (Li), tantalum (Ta), copper (Cu), molybdenum (Mo), strontium (Sr), zirconium (Zr), lead (Pb), Niobium (Nb), chromium (Cr), indiumtin oxide (ITO), gallium arsenide (GaAs), their compounds and their alloys, on the glass and flexible substrates using reactive radio frequency magnetron sputtering, without substrate heating.

Figure 1:
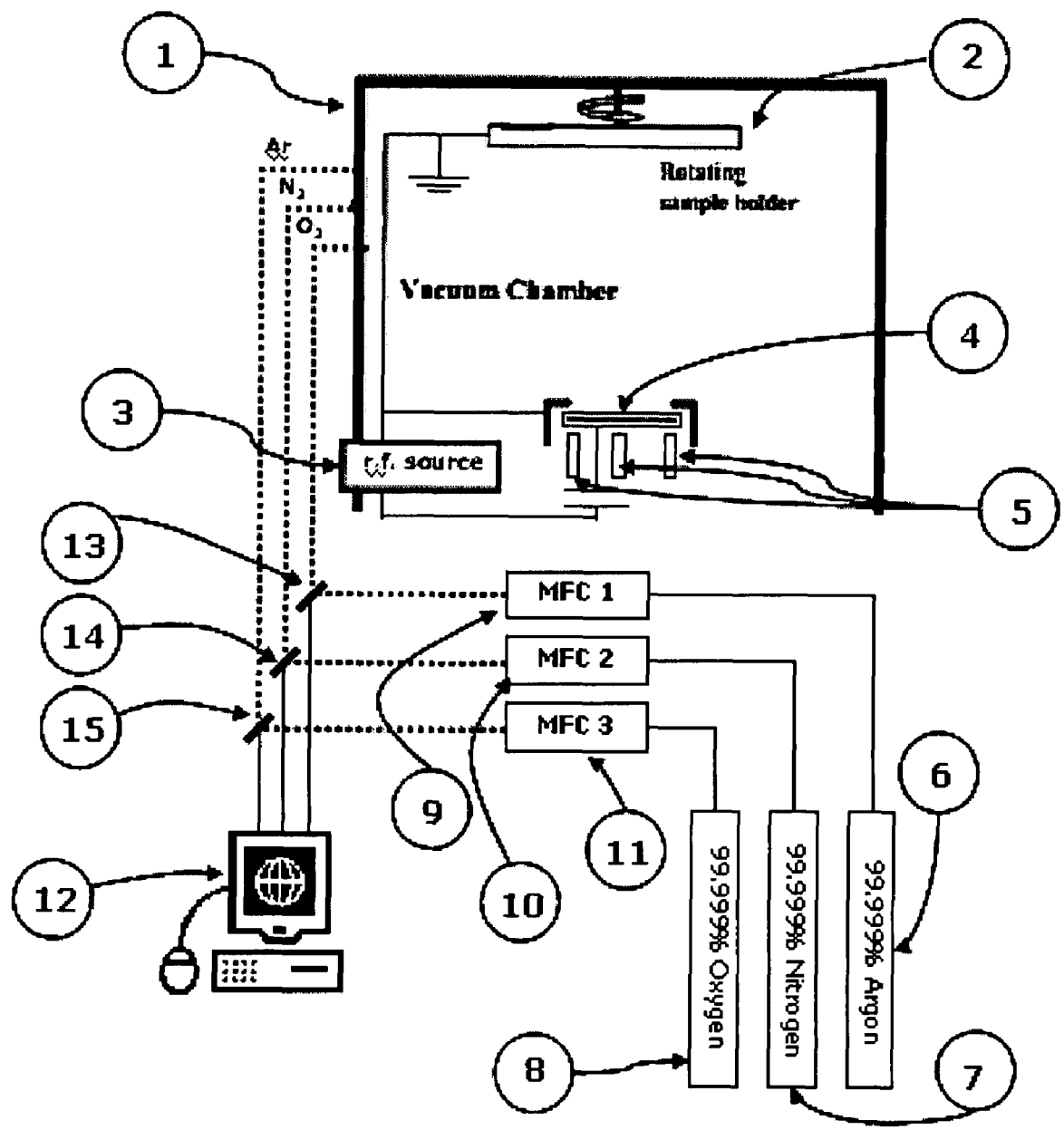
FIG. 1 shows a vacuum and control apparatus used for three gases in the sputtering process.
Figure 2:
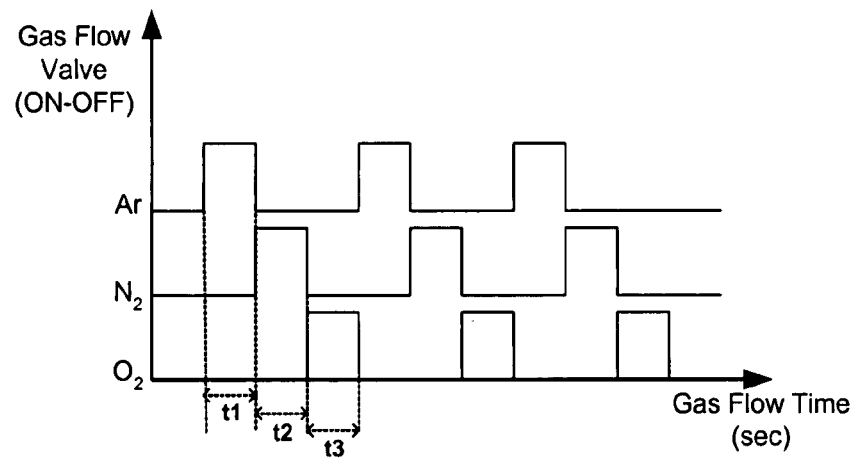
FIG. 2 shows a gas-timing sequence of Ar (t1), $N_2$ (t2), and $O_2$ (t3) fed into a sputtering chamber alternately at least 1 second (sec).
Figure 2:
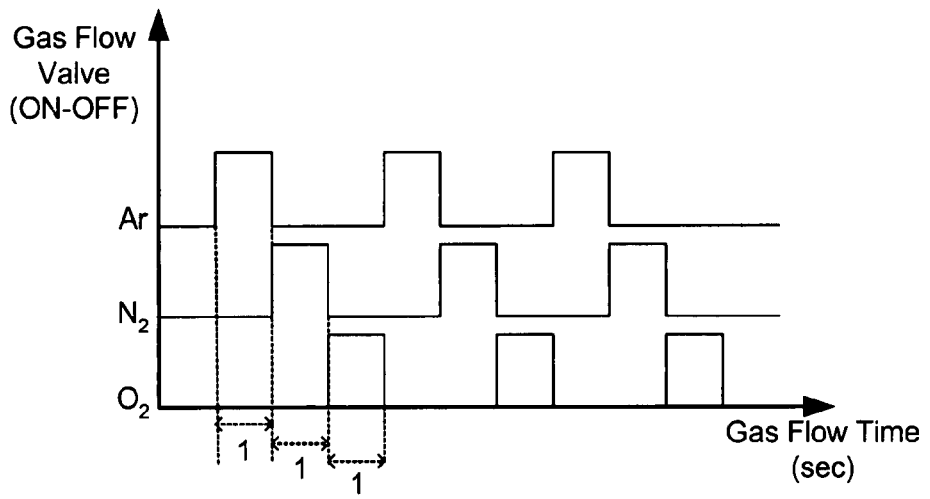
Figure 2:
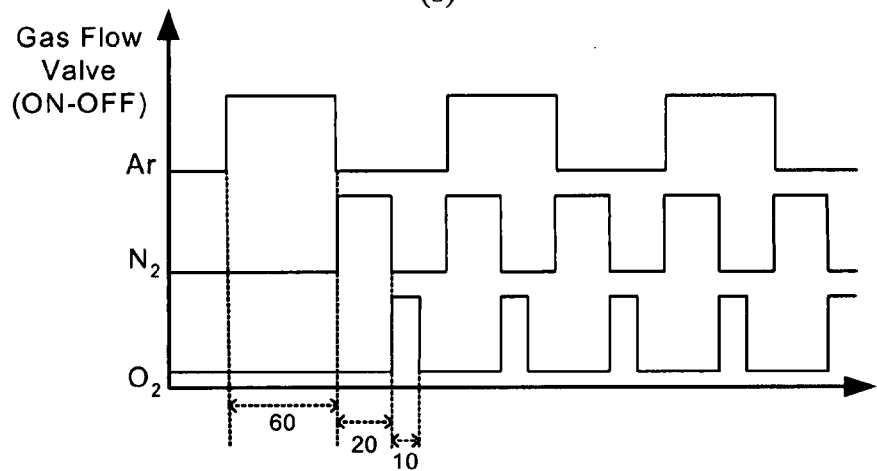
Figure 3:
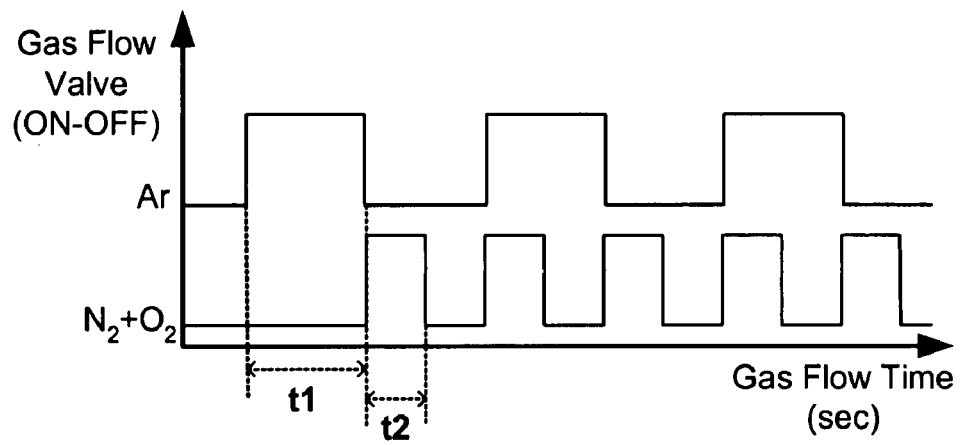
FIG. 3 shows a gas-timing sequence of Ar (t1) and mixed $N_2+O_2$ (t2) fed into a sputtering chamber alternately at least 1 second (sec).
Figure 3:
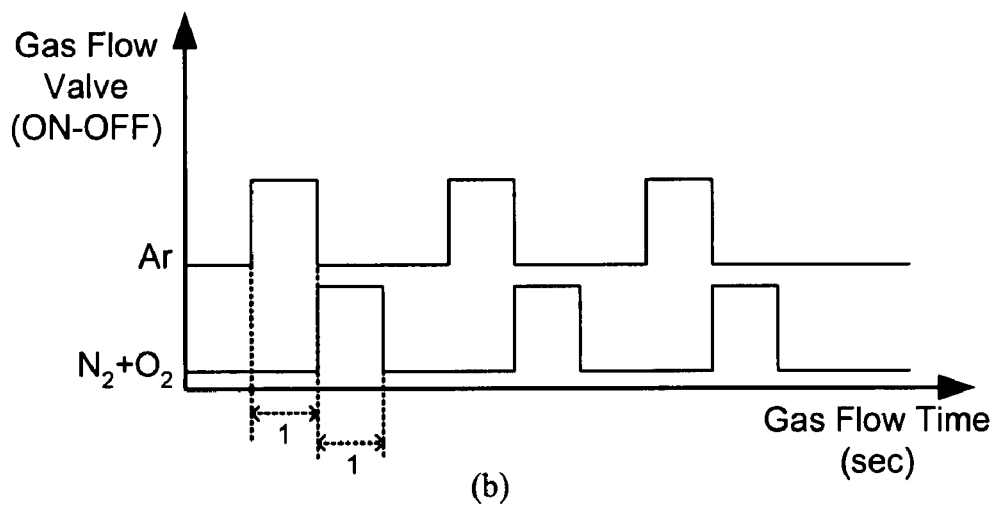
Figure 3:
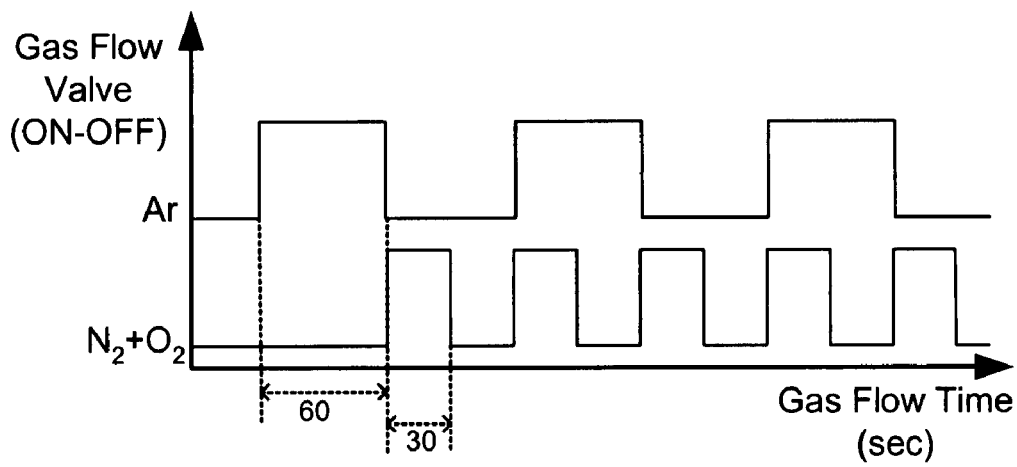
Figure 4:
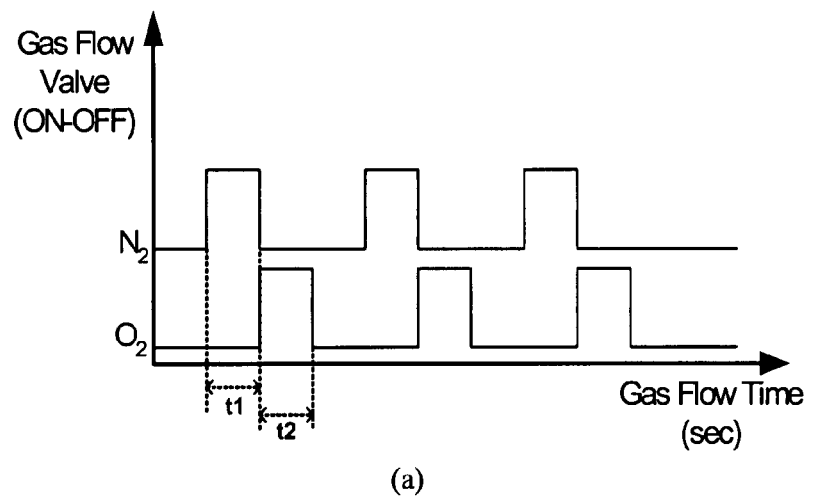
FIG. 4 shows a gas-timing sequence of $N_2$ (t1) and $O_2$ (t2) flow into a sputtering chamber alternately at least 1 second (sec).
Figure 4:
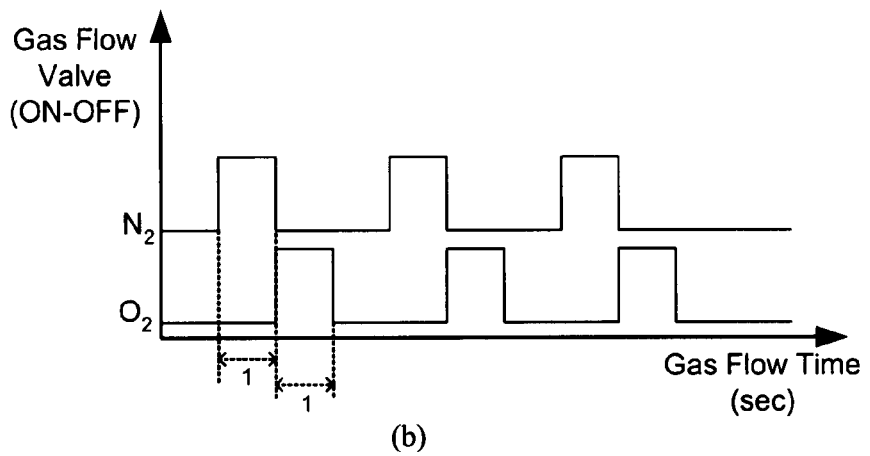
Figure 4:
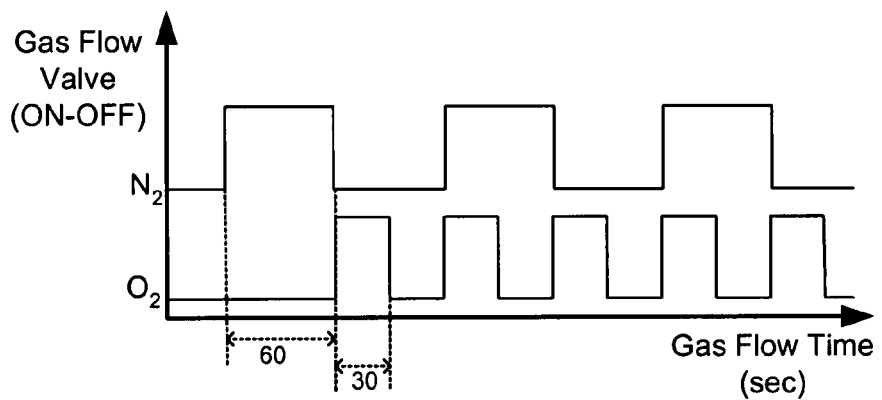

FIG. 1 shoes a vacuum and control apparatus used for three gases in the sputtering process. Three mass flow controllers (MFCs) 9, 10, 11 are used to control the flow rate of ultra high purity of argon (Ar) 6, nitrogen ($N_2$) 7 and oxygen ($O_2$) 8 as the sputtering gases fed into the vacuum chamber. As shown in FIG. 1, a RF magnetron 5 sputtering process includes a target 4 and a substrate on rotating sample holder 2 in vacuum chamber 1. The gas flow rate sequence control called gas-timing is a significantly efficient process for film growing, especially for depositing $M_x(ON)_y$ onto the substrate. The argon is fed into the chamber 1 as ion bombardment, while nitrogen and oxygen are reactive gas plasma generated by radio frequency. The substrates are cleaned by specific processes depending on the substrate type. The chamber 1 is evacuated until ~$10^{-7}$ mbar. The sputtering process begins with feeding argon and/or nitrogen and oxygen through mass flow controller valves 13, 14, 15 by a computer control 12. Gas-timing sequence control is executed by the computer control 12 through mass flow controllers 9-11. The respective gas-timing sequences of Ar, $N_2$ and $O_2$ are shown in FIGS. 2-4. An RF generator 3 (e.g., 13.56 MHz) generates a radio frequency power in a range of 20-600 watts. The thicknesses of films are verified by a quartz balance thickness monitor. The crystalline structure of oxynitride films depend on the gas-timing control of sputtering gases fed into the chamber for the plasma process. The gas-timing technique implemented via three process of gas flow control as shown in FIGS. 2-4 is provided as follows.

FIG. 2 depicts the gas-timing sequence of Ar (t1), $N_2$ (t2), and $O_2$ (t3) which are fed into the sputtering chamber in sequence respectively (FIG. 2(a)), while the sequence of $N_2$ and $O_2$ is interchangeable. This process includes a step of depositing the $M_x(ON)_y$ layer on the substrate with the following sequential gas flowing timing:

flowing Ar at least 1 second (FIG. 2(b)), or 60 seconds (FIG. 2(c)) into the chamber to bombard the target, the duration of bombardment can be varied to any number less or more than 60 seconds.

Second, flowing $N_2$ at least 1 second (FIG. 2(b)), or 20 seconds (FIG. 2(c)) into the chamber as reactive ions, the duration of $N_2$ flow can be varied to any number less or more than 20 seconds.

Third, flowing $O_2$ at least 1 sec (FIG. 2(b)), or 10 sec (FIG. 2(c)) into the chamber as reactive ions, the duration of $O_2$ flow can be varied to any number less or more than 10 seconds.

FIG. 3 depicts the gas-timing sequence of Ar (t1) and mixed $N_2+O_2$ (t2) alternatively fed into the sputtering chamber. As shown in FIG. 3, this process includes a step of depositing the $M_x(ON)_y$ layer on the substrate with the following sequential gas flowing timing:

First, flowing Ar at least 1 sec (FIG. 3(b)), or 60 sec (FIG. 3(c)) into the chamber for bombarding the target, the duration of bombardment can be varied to any number less or more than 60 seconds.

Second, flowing $N_2+O_2$ at least 1 sec (FIG. 3(b)), or 30 sec (FIG. 3(c)) into the chamber as reactive ions. The duration of mixed $N_2+O_2$ can be varied to any number less or more than 30 seconds.

A flow rate ratio of oxygen+nitrogen/argon is at least 0.02.

FIG. 4 depicts the gas-timing sequence of $N_2$ (t1) and $O_2$ (t2) as shown in FIG. 4(a), alternatively fed into sputtering chamber. As shown in FIG. 4, this process includes a step of depositing the $M_x(ON)_y$ layer on the substrate with the following sequential gas flowing timing:

Firstly; flow $N_2$ at least 1 sec (FIG. 4(b)), or 60 sec (FIG. 4(c)) into the chamber as ion bombarding and reactive ions, The duration of $N_2$ flow can be varied to any number less or more than 60 seconds.

Second; flow $O_2$ at least 1 sec (FIG. 4(b)), or 30 sec (FIG. 4(c)) into the chamber as reactive ions. The duration of $O_2$ flow can be varied to any number less or more than 30 seconds.

A flow rate ratio of oxygen/nitrogen is at least 0.01.

The $M_x(ON)_y$ layer has a thickness of 100-1000 nm and a transmission wavelength thereof depending on growth conditions, such as an RF sputtering power of 20-600 W, a gas-timing of 1-60 sec., and a gas flow rate of 0-50 sccm, etc.

The principles, preferred embodiments and modes of operation of the present invention have been described in the foregoing specification. However, the invention which is intended to be protected is not limited to the particular embodiments disclosed. The embodiments described herein are illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A reactive gas-timing control method for growing a metal and transition oxynitride ($M_x(ON)_y$) layer, comprising:
providing a sputtering chamber, a radio frequency generator, glass and/or flexible substrates, and metal, transition metal, or transition metal alloy as a target;
sequentially and alternately introducing argon, nitrogen and oxygen gases into the sputtering chamber, each at a respective gas-timing sequence, each gas-timing sequence comprising a plurality of on/off flow durations; and irradiating a radio frequency wave of 13.56 MHz at the target in the sputtering chamber to decompose the gases.

2. The method according to claim 1, wherein the sequentially and alternately introducing step involves alternately sending a flow of Ar, a flow of $N_2$, and a flow of $O_2$ into the sputtering chamber at a fixed period of at least 1 second.

3. The method according to claim 1, wherein the sequentially and alternately introducing step involves alternately sending a flow of Ar and a flow of mixed $N_2$ and $O_2$ into the sputtering chamber at a fixed period of at least 1 second.

4. The method according to claim 1, wherein the sequentially and alternately introducing step involves alternately sending a flow of $N_2$ and a flow of $O_2$ into the sputtering chamber at a fixed period of at least 1 second.

5. The method according to claim 1, wherein the radio frequency wave is powered in a range of 20-600 watts.

6. The method according to claim 1, wherein the $M_x(ON)_y$ layer includes at least one of an amorphous, nanocrystalline, polycrystalline metal, transition metal, and transition metal alloys.

7. The method according to claim 1, wherein the $M_x(ON)_y$ layer has a thickness of 100-1000 nm.

8. The method according to claim 1, wherein a transmission wavelength of the $M_x(ON)_y$ layer depends on growth conditions.

9. The method according to claim 6, wherein the Mx(ON)y layer includes boron (B), aluminum (Al), gallium (Ga), indium (In), titanium (Ti), silicon (Si), zinc (Zn), tin (Sn), nickel (Ni), iron (Fe), lithium (Li), tantalum (Ta), copper (Cu), molybdenum (Mo), strontium (Sr), zirconium (Zr), lead (Pb), Niobium (Nb), chromium (Cr), indiumtin oxide (ITO), gallium arsenide (GaAs), or a combination thereof.

10. The method according to claim 3, wherein a flow rate ratio of oxygen+nitrogen/argon is at least 0.02.

11. The method according to claim 4, wherein a flow rate ratio of oxygen/nitrogen is at least 0.01.

12. The method of claim 1, wherein the introducing step comprises setting the respective on/off flow durations of each gas-timing sequence to thereby control the formation of the oxynitride layer produced.

13. The method of claim 1, wherein the introducing step comprises running the gas-timing sequences comprising the respective on/off flow durations for each gas concurrently.

14. The method of claim 13, wherein respective gas-timing sequences comprising the on/off flow duration cycles are independent from each other.

15. The method of claim 12, wherein the introducing step comprises controlling the flow of the respective gas using a respective gas flow valve, which respective valve permits the flow of respective gas at the respective gas-timing sequences.

* * * * *